US011004696B1

(12) United States Patent
Shen et al.

(10) Patent No.: US 11,004,696 B1
(45) Date of Patent: May 11, 2021

(54) METHOD FOR MANUFACTURING POWER DIODE

(71) Applicant: ACTRON TECHNOLOGY CORPORATION, Taoyuan (TW)

(72) Inventors: I-Dar Shen, Taoyuan (TW); Jung-Hsien Lan, Taoyuan (TW)

(73) Assignee: ACTRON TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 16/908,637

(22) Filed: Jun. 22, 2020

(30) Foreign Application Priority Data

Feb. 13, 2020 (TW) .................. 109104440

(51) Int. Cl.
| | |
|---|---|
| *H01L 21/56* | (2006.01) |
| *H01L 29/872* | (2006.01) |
| *H01L 29/861* | (2006.01) |
| *H01L 29/868* | (2006.01) |

(52) U.S. Cl.
CPC ............ *H01L 21/56* (2013.01); *H01L 29/861* (2013.01); *H01L 29/868* (2013.01); *H01L 29/872* (2013.01)

(58) Field of Classification Search
CPC ..... H01L 21/56; H01L 29/868; H01L 29/872; H01L 29/861
See application file for complete search history.

(56) References Cited

U.S. PATENT DOCUMENTS

| | | | | |
|---|---|---|---|---|
| 5,763,326 | A | * | 6/1998 | Barth ................ H01L 21/02054 134/1.2 |
| 6,492,203 | B1 | | 12/2002 | Wakashima et al. |
| 2006/0051902 | A1 | * | 3/2006 | Sheen ................ H01L 29/6609 438/133 |
| 2013/0200502 | A1 | * | 8/2013 | Nikitin .................... H01L 24/97 257/666 |

(Continued)

FOREIGN PATENT DOCUMENTS

| | | |
|---|---|---|
| CN | 105965738 | 1/2018 |
| TW | 200636965 | 10/2006 |

(Continued)

OTHER PUBLICATIONS

"Office Action of Taiwan Counterpart Application", dated Sep. 4, 2020, p. 1-p. 5.

*Primary Examiner* — Nicholas J Tobergte
(74) *Attorney, Agent, or Firm* — JCIPRNET

(57) ABSTRACT

A method for manufacturing a power diode including the following steps is provided. (a) A semi-finished product of the power diode is provided. The semi-finished product of the power diode includes a first electrode, a second electrode, a semiconductor chip, and an adhesive material. The semiconductor chip is located between the first electrode and the second electrode. The adhesive material is located on the first electrode and surrounds the semiconductor chip. (b) The semi-finished product of the power diode is placed into a processing chamber. (c) Pressure in the processing chamber is adjusted to a first predetermined pressure and the first (Continued)

predetermined pressure is maintained for a predetermined time. (d) Pressure in the processing chamber is adjusted to a second predetermined pressure. Step (c) to Step (d) are performed at least twice to form the power diode. (e) The power diode is removed from the processing chamber.

10 Claims, 4 Drawing Sheets

(56) References Cited

U.S. PATENT DOCUMENTS

2014/0021634 A1* 1/2014 Nikitin ................ H01L 23/5389
257/774

FOREIGN PATENT DOCUMENTS

| TW | 200935526 | 8/2009 |
| TW | M493152 | 1/2015 |
| TW | 201511140 | 3/2015 |

* cited by examiner

METHOD FOR MANUFACTURING POWER DIODE

CROSS-REFERENCE TO RELATED APPLICATION

This application claims the priority benefit of Taiwan patent application serial no. 109104440, filed on Feb. 13, 2020. The entirety of the above-mentioned patent application is hereby incorporated by reference here and made a part of this specification.

BACKGROUND

Technical Field

The disclosure relates to a method for manufacturing a semiconductor element, and more particularly to a method for manufacturing a power diode.

Description of Related Art

Generally speaking, a dispensing process is often performed around chips in order to meet the requirement of protecting the chips during the manufacturing process of an existing power diode. However, many air bubbles are often produced when an adhesive material is formed. The presence of the air bubbles may cause adverse effects to the power diode, thereby reducing the quality of the power diode. Therefore, how to effectively remove the air bubbles in the adhesive material, thereby improving the quality of the power diode has become a topic requiring urgent solution.

SUMMARY

The disclosure provides a method for manufacturing a power diode, which can effectively remove air bubbles in an adhesive material, thereby improving the quality of the power diode, and is particularly applied to a manufacturing process of a vehicle rectifier diode, such that the power diode complies with the high reliability requirement of vehicle electronic products.

A method for manufacturing a power diode of the disclosure includes the following steps. (a) A semi-finished product of the power diode is provided. The semi-finished product of the power diode includes a first electrode, a second electrode, a semiconductor chip, and an adhesive material. The semiconductor chip is located between the first electrode and the second electrode. The adhesive material is located on the first electrode and surrounds the semiconductor chip. (b) The semi-finished product of the power diode is placed into a processing chamber. (c) Pressure in the processing chamber is adjusted to a first predetermined pressure and the first predetermined pressure is maintained for a predetermined time. (d) Pressure in the processing chamber is adjusted to a second predetermined pressure. Step (c) to Step (d) are performed at least twice to form the power diode. (e) The power diode is removed from the processing chamber.

In an embodiment of the disclosure, the at least twice above is three to five times.

Based on the above, the disclosure can change a surface tension of the air bubbles in the adhesive material of the semi-finished of the power diode by converting between the first predetermined pressure and the second predetermined pressure in the processing chamber to achieve the effect of eliminating the air bubbles. Also, the air bubbles in the adhesive material can be effectively removed by performing the step of adjusting pressure in the processing chamber to the first predetermined pressure and maintaining the first predetermined pressure for the predetermined time, and the step of adjusting pressure in the processing chamber to the second predetermined pressure at least twice, thereby improving the quality of the power diode.

To make the aforementioned and other features of the disclosure more comprehensible, several embodiments accompanied with drawings are described in detail as follows.

DETAILED DESCRIPTION OF DISCLOSED EMBODIMENTS

Figure 1:
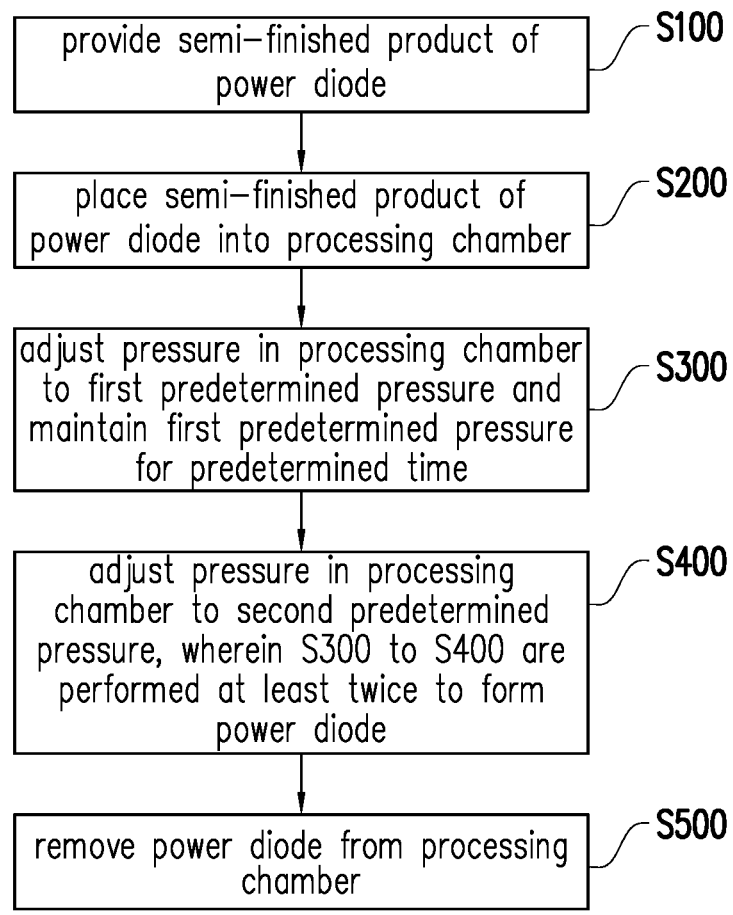
FIG. 1 is a flowchart of a manufacturing process of a power diode according to an embodiment of the disclosure.

Exemplary embodiments of the disclosure will be fully described below with reference to the drawings, but the disclosure may also be implemented in many different forms and should not be construed as being limited to the embodiments described herein. In the drawings, for the sake of clarity, the size and thickness of each region, part, and layer may not be drawn to actual scale. In order to facilitate understanding, the same diodes in the following descriptions will be described with the same reference numeral.

No method described herein is intended to be construed as requiring the steps thereof to be performed in a particular order unless explicitly stated otherwise.

Figure 2A:
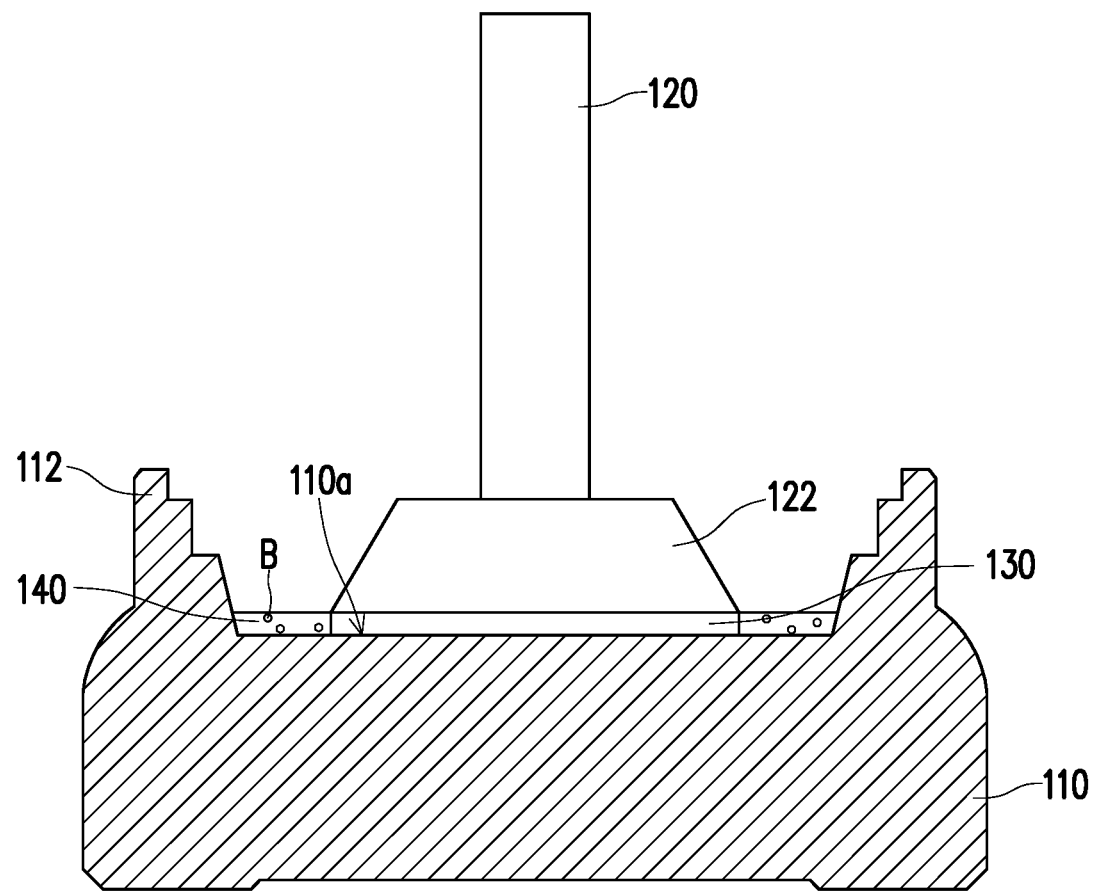
FIG. 2A to FIG. 2C are schematic views of each step in a manufacturing process of a power diode according to an embodiment of the disclosure.
Figure 2B:
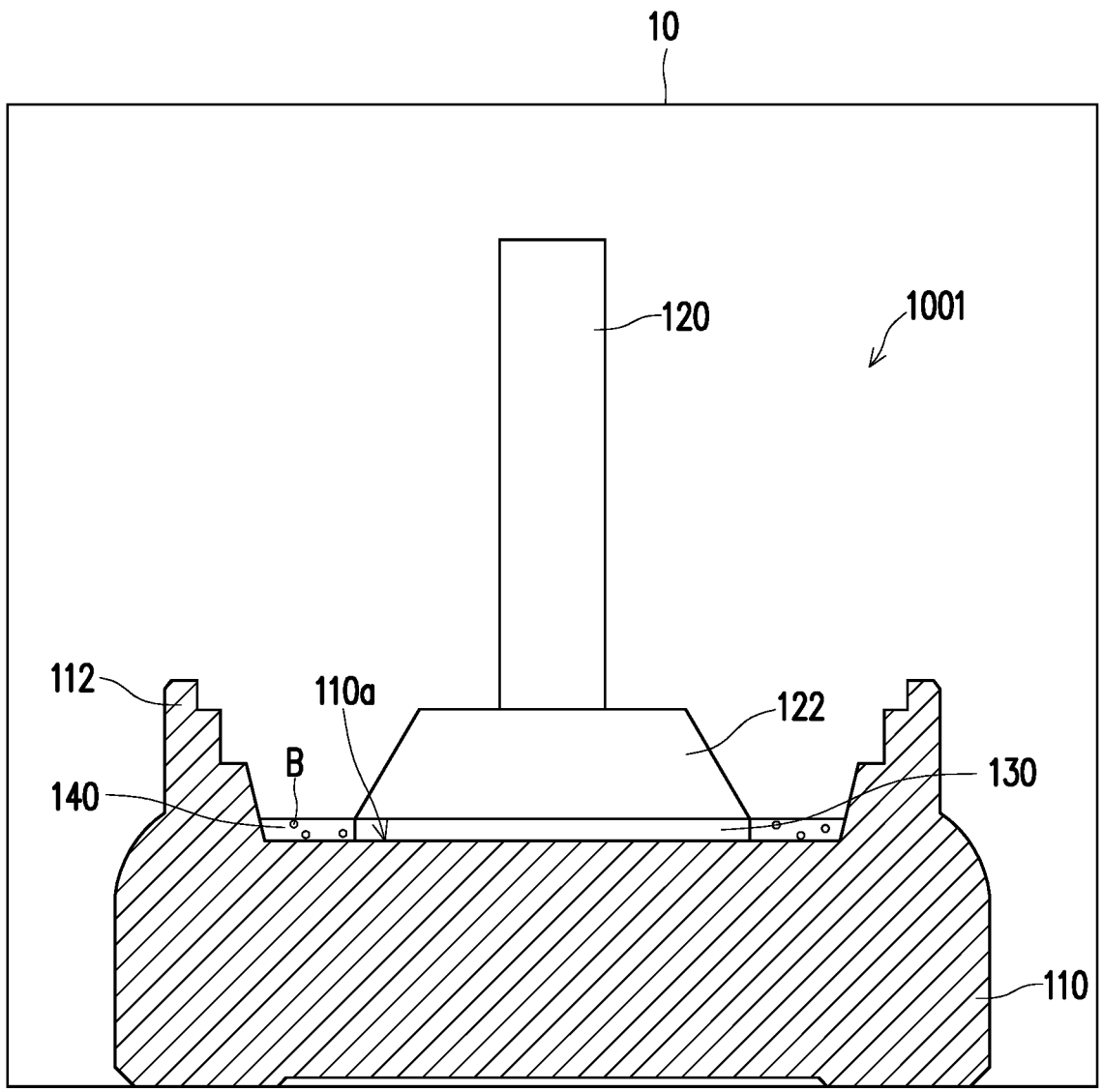
Figure 2C:
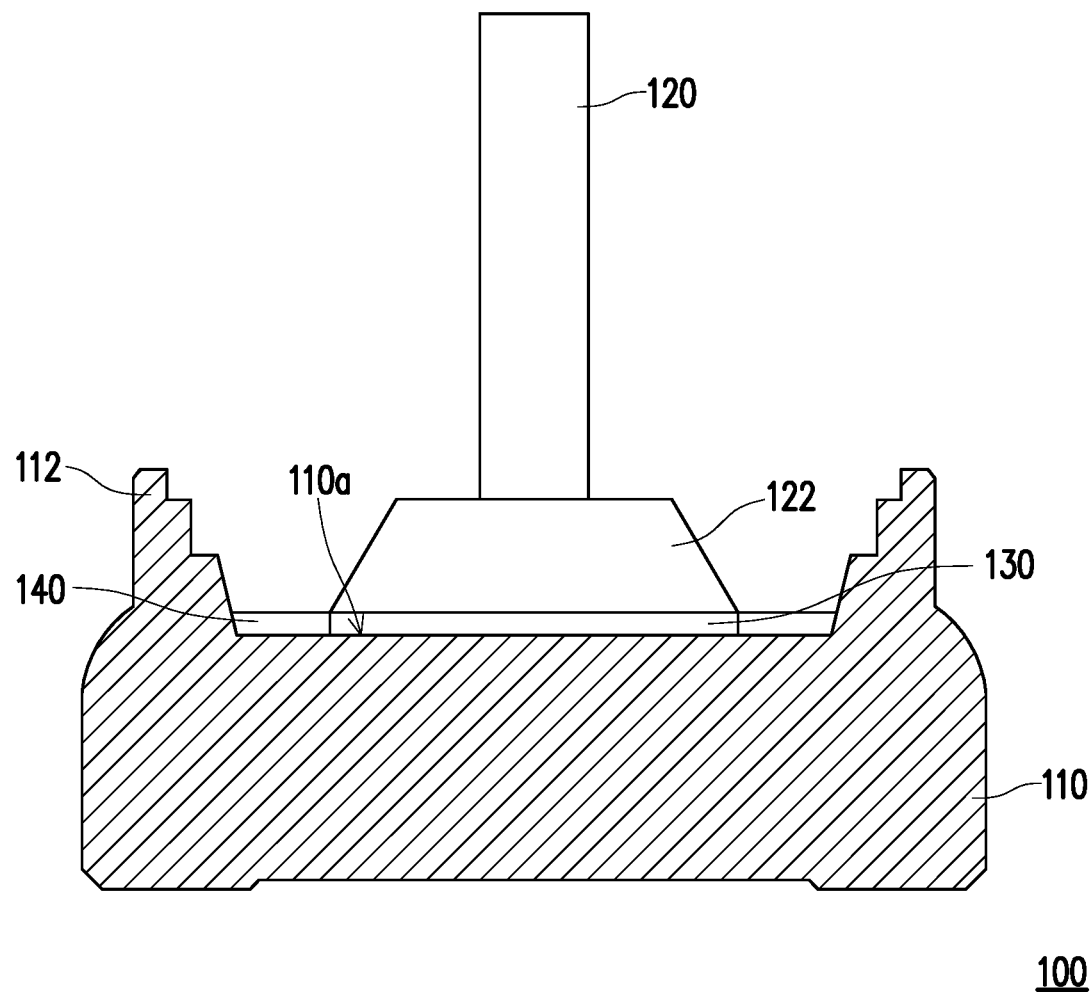

FIG. 1 is a flowchart of a manufacturing process of a power diode according to an embodiment of the disclosure. The power diode is, for example, a vehicle rectifier diode, and particularly a press-fit diode for rectification installed on a vehicle generator. FIG. 2A to FIG. 2C are schematic views of each step in a manufacturing process of a power diode according to an embodiment of the disclosure.

In the embodiment, a manufacturing method of a power diode 100 may include the following steps.

Please refer to FIG. 1 and FIG. 2A at the same time. First, Step S100 is performed to provide a semi-finished product 1001 of the power diode, as shown in FIG. 2A. The semi-finished product 1001 of the power diode includes a first electrode 110, a second electrode 120, and a semiconductor chip 130, wherein the semiconductor chip 130 is located between the first electrode 110 and the second electrode 120. The first electrode 110 and the second electrode 120 are respectively electrode structures of the power diode 100, and are assembled with the semiconductor chip 130 by welding to achieve a state of electrical connection with each other. Accordingly, the inflow of alternating current is rectified into direct current by the semiconductor chip 130 having rectifying function and is then outputted from the power diode 100.

The first electrode 110 is, for example, a cup-shaped base electrode having a bottom surface 110a and a side-wall structure 112 surrounding and erected on the bottom surface 110a, so as to form the cup-shaped contour. However, the disclosure is not limited thereto. The first electrode 110 of the power diode 100 may be designed as a base electrode of different forms according to product requirements. For example, the first electrode 110 may not have the side-wall structure 112 or further includes a protruding base on the bottom surface 110a to place the semiconductor chip 130. The second electrode 120 is, for example, a lead electrode having a convex portion 122. The convex portion 122 may be accommodated in a space formed by the bottom surface 110a and the side-wall structure 112. The materials of the first electrode 110 and the second electrode 120 are, for example, copper, aluminum, or a combination thereof, but the disclosure is not limited thereto. The materials of the first electrode 110 and the second electrode 120 may be made of other suitable conductive materials.

In order to meet the requirement of protecting the semiconductor chip 130, the semi-finished product 1001 of the power diode further includes an adhesive material 140, wherein the adhesive material 140 is located on the first electrode 110 and surrounds the semiconductor chip 130. For example, the adhesive material 140 may be filled in a gap between the side-wall structure 112 and the semiconductor chip 130. In an embodiment, the adhesive material 140 may surround the semiconductor chip 130 in a close-looped manner (not shown). The material of the adhesive material 140 may be polyimide, but the disclosure is not limited thereto, and the material of the adhesive material 140 may be determined according to actual design requirements. The adhesive material 140 may be coated around the semiconductor chip 130 by a dispensing method. In the embodiment, as shown in FIG. 2A, air bubbles B may be produced when the adhesive material 140 is formed.

Please refer to FIG. 1, FIG. 2A, and FIG. 2B at the same time. Step S200 is performed to place the semi-finished product 1001 of the power diode into a processing chamber 10. Here, the processing chamber 10 is a chamber capable of forming a vacuum environment, such that the semi-finished product 1001 of the power diode may perform subsequent steps to achieve the effect of eliminating the air bubbles B. Next, Step S300 is performed to adjust pressure in the processing chamber 10 to a first predetermined pressure. For example, pressure in the processing chamber 10 is reduced to the first predetermined pressure, such that the processing chamber 10 tends to the vacuum environment. In an embodiment, the first predetermined pressure may be less than 260 torr. Preferably, the first predetermined pressure may be between 10 torr and 260 torr. On the other hand, it is necessary to maintain the first predetermined pressure for a predetermined time, such that a surface tension of the air bubbles B in the adhesive material 140 may have significant changes. In an embodiment, the predetermined time may be above 30 seconds.

Please refer to FIG. 1, FIG. 2B, and FIG. 2C. Step S400 is perform to adjust pressure in the processing chamber 10 to a second predetermined pressure, wherein Step S300 to Step S400 may be sequentially performed after placing the semi-finished product 1001 of the power diode into the processing chamber 10. The first predetermined pressure may be different from the second predetermined pressure. In an embodiment, the first predetermined pressure may be less than the second predetermined pressure. For example, pressure in the processing chamber 10 is increased from the first predetermined pressure to the second predetermined pressure, such that the processing chamber 10 is converted from the vacuum environment to a normal pressure environment. In an embodiment, the second predetermined pressure may be 760 torr. In the embodiment, the surface tension of the air bubbles B in the adhesive material 140 of the semi-finished product 1001 of the power diode may be changed by converting between the first predetermined pressure and the second predetermined pressure in the processing chamber 10 to achieve the effect of eliminating the air bubbles B.

Please continue to refer to FIG. 1, FIG. 2B, and FIG. 2C. Step S300 to Step S400 may be performed at least twice to form the power diode 100. Next, Step S500 is performed to remove the power diode 100 from the processing chamber 10. Further, Step S300 to Step S400 are performed at least twice. For example, pressure in the processing chamber 10 is first adjusted to the first predetermined pressure after placing the semi-finished product 1001 of the power diode into the processing chamber 10, the first predetermined pressure is maintained for the predetermined time, pressure in the processing chamber 10 is then adjusted from the first predetermined pressure to the second predetermined pressure, and then the steps are repeated one or more times. That is, pressure in the processing chamber 10 is adjusted from the second predetermined pressure to the first predetermined pressure, the first predetermined pressure is maintained, and then pressure in the processing chamber 10 is adjusted from the first predetermined pressure to the second predetermined pressure. In an embodiment, for example, Step S300 to Step S400 are performed three to five times to achieve the effect of better eliminating the air bubbles B. In an embodiment, a baking process may be further performed after removing the power diode 100 from the processing chamber 10.

The air bubbles B in the adhesive material 140 can be effectively removed by performing Step S300 to Step S400 at least twice, thereby improving the quality of the power diode 100. For example, in an embodiment, after performing Step S300 to Step S400 once, the ratio of the air bubbles B in the adhesive material 140 is 4.98%, and after performing Step S300 to Step S400 at least twice, the ratio of the air bubbles B in the adhesive material 140 may be reduced to 0%. In another embodiment, after performing Step S300 to Step S400 once, the ratio of the air bubbles B in the adhesive material 140 is 5.45%, and after performing Step S300 to Step S400 three times, the ratio of the air bubbles B in the adhesive material 140 may be reduced 1.75%. Therefore, the air bubbles B in the adhesive material 140 can be effectively removed by performing Step S300 to Step S400 at least twice, thereby improving the quality of the power diode 100.

It should be noted that the disclosure does not limit the method of adjusting pressure in the processing chamber 10. Pressure in the processing chamber 10 may be adjusted by a suitable method to achieve the required first predetermined pressure and second predetermined pressure. Also, the disclosure does not limit the magnitudes of the first predetermined pressure and the second predetermined pressure and the number of times of performing Step S300 to Step S400. As long as the required effect of eliminating the air bubbles can be achieved, all of the same fall within the protection scope of the disclosure.

In summary, the disclosure can change the surface tension of the air bubbles in the adhesive material of the semi-finished of the power diode by converting between the first predetermined pressure and the second predetermined pressure in the processing chamber to achieve the effect of eliminating the air bubbles. Also, the air bubbles in the adhesive material can be effectively removed by performing the step of adjusting pressure in the processing chamber to the first predetermined pressure and maintaining the first predetermined pressure for the predetermined time, and the step of adjusting pressure in the processing chamber to the second predetermined pressure at least twice, thereby improving the quality of the power diode.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method for manufacturing a power diode, comprising:
   (a) providing a semi-finished product of a power diode, wherein the semi-finished product of the power diode comprises:
      a first electrode and a second electrode;
      a semiconductor chip, located between the first electrode and the second electrode; and
      an adhesive material, located on the first electrode and surrounding the semiconductor chip;
   (b) placing the semi-finished product of the power diode into a processing chamber;
   (c) adjusting pressure in the processing chamber to a first predetermined pressure and maintaining the first predetermined pressure for a predetermined time;
   (d) adjusting pressure in the processing chamber to a second predetermined pressure, wherein Step (c) to Step (d) are performed at least twice to form the power diode; and
   (e) removing the power diode from the processing chamber.

2. The method for manufacturing the power diode according to claim 1, wherein Step (c) to Step (d) are sequentially performed at least three to five times after placing the semi-finished product of the power diode into the processing chamber.

3. The method for manufacturing the power diode according to claim 1, wherein the first predetermined pressure is different from the second predetermined pressure.

4. The method for manufacturing the power diode according to claim 1, wherein the first predetermined pressure is less than the second predetermined pressure.

5. The method for manufacturing the power diode according to claim 1, wherein the first predetermined pressure is less than 260 torr.

6. The method for manufacturing the power diode according to claim 1, wherein the first predetermined pressure is between 10 torr and 260 torr.

7. The method for manufacturing the power diode according to claim 1, wherein the second predetermined pressure is 760 torr.

8. The method for manufacturing the power diode according to claim 1, wherein the predetermined time is above 30 seconds.

9. The method for manufacturing the power diode according to claim 1, wherein the power diode is a vehicle rectifier diode.

10. The method for manufacturing the power diode according to claim 1, wherein a baking process is further performed after removing the power diode from the processing chamber.

* * * * *